US010862509B1

(12) United States Patent
Heil et al.

(10) Patent No.: US 10,862,509 B1
(45) Date of Patent: Dec. 8, 2020

(54) FLEXIBLE HUFFMAN TREE APPROXIMATION FOR LOW LATENCY ENCODING

(71) Applicant: Microsoft Technology Licensing, LLC, Redmond, WA (US)

(72) Inventors: Timothy Hume Heil, Woodinville, WA (US); Bogdan Alexandru Burlacu, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/586,034

(22) Filed: Sep. 27, 2019

Related U.S. Application Data

(60) Provisional application No. 62/888,313, filed on Aug. 16, 2019.

(51) Int. Cl.
*H03M 7/42* (2006.01)
(52) U.S. Cl.
CPC .................... *H03M 7/42* (2013.01)
(58) Field of Classification Search
CPC ...................................... H03M 7/42
USPC ..................................... 341/55–85
See application file for complete search history.

(56) References Cited

U.S. PATENT DOCUMENTS

| | | | | |
|---|---|---|---|---|
| 5,479,527 A * | 12/1995 | Chen | ............... | H03M 7/42 375/E7.139 |
| 8,320,473 B1 * | 11/2012 | Conway | ............... | H03M 7/3082 341/106 |
| 9,825,647 B1 * | 11/2017 | Satpathy | ............... | H03M 7/3082 |
| 10,135,463 B1 * | 11/2018 | Satpathy | ............... | H03M 7/6023 |
| 2010/0195739 A1 | 8/2010 | Lu et al. | | |
| 2013/0297575 A1 | 11/2013 | Fallon et al. | | |
| 2016/0366403 A1 * | 12/2016 | Wang | ............... | H04N 19/13 |
| 2018/0084280 A1 * | 3/2018 | Thiagarajan | ............... | H04N 19/91 |

OTHER PUBLICATIONS

"Canonical Huffman code", Retrieved from: https://web.archive.org/web/20190812031445/https://en.wikipedia.org/wiki/Canonical_Huffman_code, Aug. 12, 2019, 5 Pages.
"DEFLATE", Retrieved from: https://web.archive.org/web/20190812031443/https://en.wikipedia.org/wiki/DEFLATE, Aug. 12, 2019, 7 Pages.
"Huffman coding", Retrieved from: https://web.archive.org/web/20190812031445/https://en.wikipedia.org/wiki/Huffman_coding, Aug. 12, 2019, 11 Pages.
Deutsch, Peter, "DEFLATE Compressed Data Format Specification version 1.3". Retrieved from: https://tools.ietf.org/html/rfc1951, May 1996, 15 Pages.
Huffman, David A., "A Method for the Construction of Minimum-Redundancy Codes", In Proceedings of Institute of Radio Engineers, vol. 40, Issue 9, Sep. 1952, pp. 1098-1101.

(Continued)

*Primary Examiner* — Lam T Mai
(74) *Attorney, Agent, or Firm* — Klarquist Sparkman, LLP

(57) ABSTRACT

Techniques are described for encoding symbols using a new algorithm that provides a flexible Huffman tree approximation and that can be used for low latency encoding. For example, the new algorithm can perform encoding using one or more of the following phases: Shannon-based binning, code space optimization, tree completion, and code assignment.

20 Claims, 9 Drawing Sheets

(56) References Cited

OTHER PUBLICATIONS

Kim, et al., "Energy efficient canonical huffman encoding", In Proceedings of IEEE 25th International Conference on Application-Specific Systems, Architectures and Processors, Jun. 18, 2014, 8 Pages.

Satpathy, et al., "A 220-900mv 179mcode/s 36pj/code canonical huffman encoder for deflate compression in 14nm CMOS", In Proceedings of IEEE Custom Integrated Circuits Conference. Apr. 14, 2019, 4 Pages.

Shannon, C. E., "A mathematical theory of communication", In Bell system technical journal, vol. 27, Issue 3. Jul. 1948, pp. 379-423.

Tufte, Edward R., "The Visual Display of Quantitative Information", In Publication of Graphics Press, 1983, 17 Pages.

"Shannon Coding", Retrieved from: https://web.archive.org/web/20190812031444/https://en.wikipedia.org/wiki/Shannon_coding, Aug. 12, 2019, 2 Pages.

"International Search Report and Written Opinion Issued in PCT Application No. PCT/US20/037674", dated Sep. 23, 2020, 13 Pages.

Weerd, Mathijs De, "Huffman Codes", Retrieved from: https://web.archive.org/web/20170519092207if_/http://www.c.s.princeton.edu:80/~wayne/kleinberg-tardos/pearson/04Huffman.pdf, May 19, 2017, 24 Pages.

* cited by examiner

FLEXIBLE HUFFMAN TREE APPROXIMATION FOR LOW LATENCY ENCODING

CROSS REFERENCE TO RELATED APPLICATIONS

This application claims the benefit of U.S. Provisional Application No. 62/888,313, filed Aug. 16, 2019, which is hereby incorporated by reference.

BACKGROUND

Huffman trees have been the de-facto standard for optimal encoding since their introduction. Their applications span a wide spectrum ranging from real-time multimedia to data-center storage. Huffman tree construction is well understood, and numerous research papers explore Huffman tree properties and implementations in both software and hardware. Notably, Huffman encoding is, from a formal algorithmic perspective, optimal within the constraint of integer length codes.

While Huffman encoding is optimal within the constraint of integer length codes, Huffman encoding can be inefficient in terms of computing resources needed to implement the algorithm. In addition, Huffman encoding brings interesting challenges for hardware implementations.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Technologies are described for encoding symbols using a new algorithm that provides a flexible Huffman tree approximation and that can be used for low latency encoding. For example, the new algorithm can perform encoding using one or more of the following phases: Shannon-based binning, code space optimization, tree completion, and code assignment.

As described herein, a variety of other features and advantages can be incorporated into the technologies as desired.

DETAILED DESCRIPTION

Overview

Figure 1:
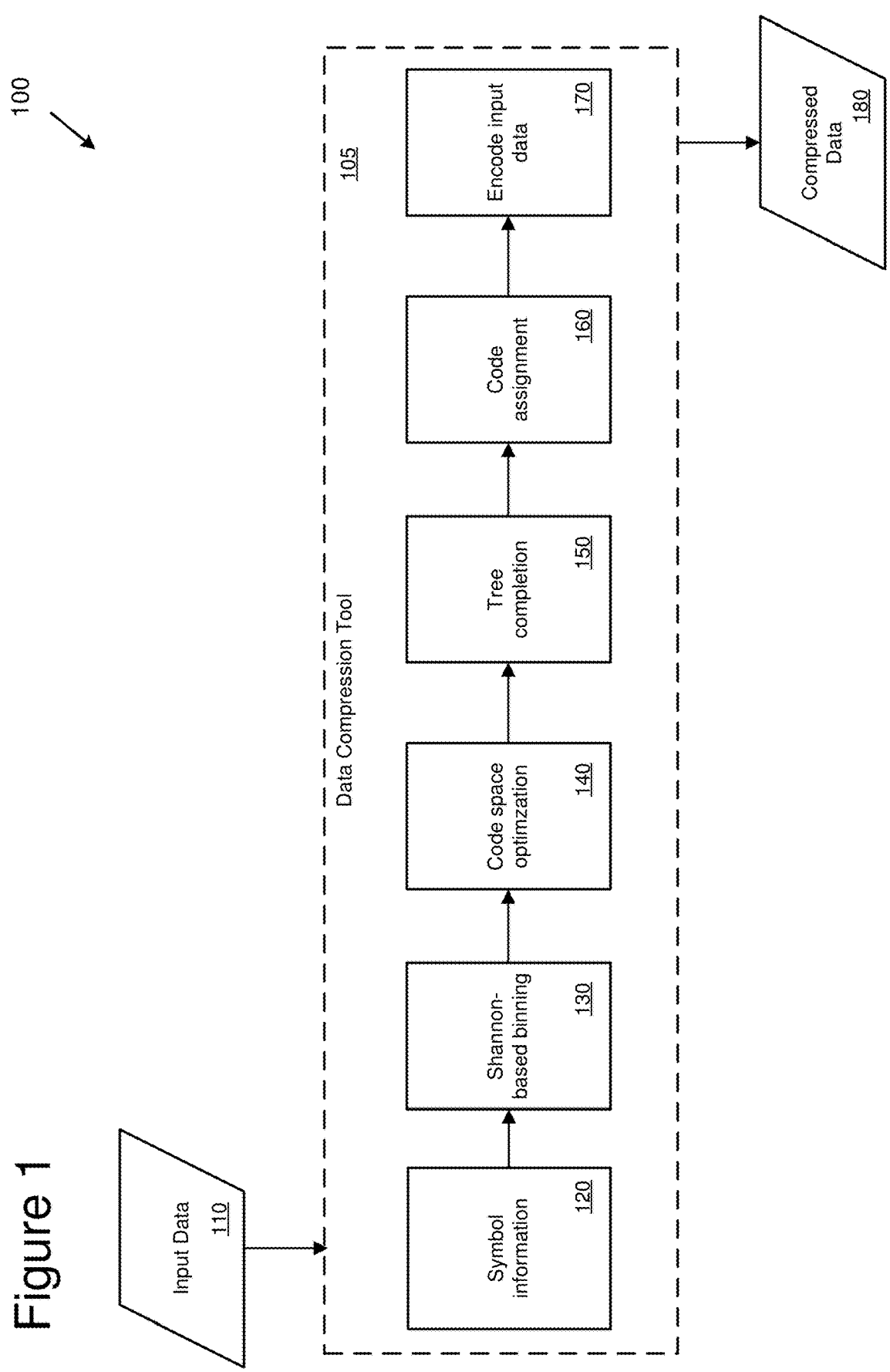
FIG. 1 is a block diagram depicting an example process for encoding data using a flexible Huffman tree approximation.

As described herein, various techniques and solutions can be applied to approximate the Huffman coding algorithm (also referred to as the Huffman algorithm, Huffman coding, or Huffman encoding) without using the Huffman coding algorithm. For example, the technologies can be applied to encode (e.g., compress) data that results in compression that is close (e.g., within a fraction of one percent) to Huffman coding but that is more efficient (e.g., in terms of computing resource, latency, hardware implementation, etc.) than Huffman coding.

The technology involves a new algorithm for approximating the Huffman algorithm. The new algorithm is also referred to as Quantization Interval Huffman Approximation (QuIHA).

Depending on the implementation, the new algorithm can have one or more of the following properties:

It produces good compression ratios, typically within 0.05% of true Huffman codes, which are provably optimal.

It is suitable for high-speed implementation in field-programmable gate arrays (FPGAs) or application-specific integrated circuits (ASICs).

For two-pass compression algorithms, it is a drop-in replacement for the Huffman algorithm, and requires no modifications to the decompressor or compressed format specification.

The new algorithm can be applied to code symbols generated from input data. For example, the input data can be a file to be compressed, data to be transmitted via a network, etc. The input data can be any type of data (e.g., text data, binary data, video data, audio data, etc.). The new algorithm is a lossless compression algorithm in which the symbols are encoded (e.g., compressed) in a lossless manner. The new algorithm produces symbols encoded with a prefix code, codes being 1 or more bits long, similar to Huffman coding. A prefix code is a term for coding symbols with variable-bit-length codes.

For example, the new algorithm can be applied as part of an encoding or compression process. For example, input data can be received (e.g., a data file, streaming media, etc.). The input data can be processed to generate symbols (e.g., as an initial stage of a deflate compression algorithm, as part of a video or image encoder, etc.). The symbols (e.g., including symbol count and frequency information) can be processed by the new algorithm (e.g., including performing Shannon-based binning, code space optimization, tree completion, and/or performing other techniques associated with the new algorithm) and codes (e.g., prefix codes) can be assigned based on the processed symbols. The input data can then be output in an encoded or compressed format using the codes (e.g., prefix codes) generated from the new algorithm.

The new process is based on two fundamental realizations. First, symbols with similar frequencies should likely be assigned the same or similar code lengths. Therefore, symbols can be collated into bins based on symbol frequency (the Shannon-based binning process is described further below). Second, symbol length assignment does not actually depend on the symbol IDs themselves. Therefore, counts of symbols in each bin can be used, rather than lists or sets of symbols, and entire bins can be processed at once. Processing an entire bin of symbols at once is more efficient in terms of computing resources than processing symbols on a symbol-by-symbol basis as is done with Huffman coding.

The new algorithm introduces the concept of code space. The code space covers all possible symbol encodings within some maximum code length constraint. For instance, Xpress8 (Xpress8 is a compression technology provided by Microsoft®) has a maximum code length of 15 bits, so the code space contains $2^{15}$=32K=32,768 possible codes of bit-length 15. A 1b (one bit) symbol uses half the codes (16K codes), a 2b (two bit) symbol uses a quarter of the codes (8K codes), and so on. Table 1 below illustrates the used code space for each bit-length up to 15.

TABLE 1

| Length/Level | Maximum symbols per length ($2^{\wedge}$code length) | Used code space per symbol (code space cost per symbol) |
|---|---|---|
| 1 | 2 | 16384 |
| 2 | 4 | 8192 |
| 3 | 8 | 4096 |
| 4 | 16 | 2048 |
| 5 | 32 | 1024 |
| 6 | 64 | 512 |
| 7 | 128 | 256 |
| 8 | 256 | 128 |
| 9 | 512 | 64 |
| 10 | 1024 | 32 |
| 11 | 2048 | 16 |
| 12 | 4096 | 8 |
| 13 | 8192 | 4 |
| 14 | 16384 | 2 |
| 15 | 32768 | 1 |

In some implementations, the new algorithm is implemented in four phases. In the first phase, Shannon-Based Binning, symbols are assigned initial code lengths based on the original Shannon algorithm. This algorithm may under-utilize code space and is suboptimal compared to the Huffman algorithm. As symbols are processed, they are placed into code-length bins (CLBs) based on their Shannon code. The results are further improved by breaking the CLBs into quantization intervals (QIs) based on symbol frequency Since the first phase leaves the code space underutilized, the subsequent code space optimization phase improves the code length assignment by elevating some symbols from their initial CLB to the CLB above, essentially reducing their code length by 1 bit. This is where the QIs come in. It is more optimal to shorten symbols that occur more frequently. By preferentially elevating symbols in the most-frequent QIs, the algorithm achieves near optimal compression ratios.

The results of code space optimization are quite good. However, the code space optimization phase is still an approximate heuristic that can leave code space underutilized. Some decompressors, such as Xpress8, require that the code space be completely allocated, which is equivalent to saying that the symbol code tree be a full binary tree in which all parent nodes have two children. The third phase, tree completion, fixes the resulting tree and can result in a slight improvement in compression ratio. The improvements are so slight that this phase can be considered optional unless required by the decompression algorithm.

The final phase is code assignment. The symbols are traversed and actual prefix codes are assigned. This phase follows a standard process, given the previously computed code lengths for each symbol.

Below is a summary of some potential features of the new algorithm. Depending on the implementation, one or more of the below features may be realized.

Use approximations of the Huffman algorithm, resulting in minor reduction in compression ratio, but much faster hardware implementation.

Collate symbols into bins, based on symbol frequency. Assign symbols in the same bins same/similar code lengths.

Use simple Shannon coding for initial code length estimate.

Further optimize code lengths based on symbol frequency bins.

Further optimize code lengths to complete the Huffman tree if necessary.

Shannon-Based Binning

In the technologies described herein, Shannon-based binning is performed as part of the new algorithm. In some implementations, Shannon-based binning is performed in the first phase of the new algorithm.

The new algorithm operates on symbols. The symbols are received as input to the new algorithm. The symbols can represent literals (e.g., character bytes) and/or other alphabets (e.g., length, distance pairs). In some implementations, the symbols are generated using the initial stage of the Deflate compression algorithm. The initial stage of the Deflate compression algorithm is called Lemple-Zif 77 (also referred to as LZ77). For example, the new algorithm can receive the symbols from the initial stage of the Deflate compression algorithm and, instead of performing Huffman coding, the new algorithm encodes the symbols using the new algorithm technologies described herein. In other implementations, the symbols are generated using another process (e.g., from an initial stage of another compression algorithm).

Shannon-based binning is performed to determine initial code lengths for the symbols and place the symbols into corresponding code-length bins (CLBs) based on the assigned initial code lengths. To determine the initial code length, Equation 1 is used to calculate the Shannon code length. Then, the information content, A), is rounded up using the ceiling operation according to Equation 2.

$$I(sym) = -\log_2\left(\frac{symCnt[sym]}{symTot}\right) \quad \text{(Equation 1)}$$

$$CLB(sym) = ceil(I(sym)) \quad \text{(Equation 2)}$$

In Equation 1, symCnt[ ] is the number of occurrences of each symbol, and symTot is the total symbols in the input (e.g., the total number of symbols produced by the initial stage of the Deflate compression algorithm from an input file to be compressed). Note that symbols that do not occur (symCnt[sym]==0) do not need code assignments and can be skipped.

In some hardware implementations symCnt and symTot are computed on-the-fly during the LZ77 phase. As each symbol is produced, symTot and SymC[sym] are incremented. The histogram of symbols is therefore available immediately at the start of building the symbol table.

For example, the Xpress8 compression format uses 512 symbols (i.e., 512 9-bit symbols). Therefore, using Xpress8, symCnt[ ] contains the number of occurrences of each of the 512 symbols in the input data to be compressed. Other compression formats can use a different number of symbols.

The number of code-length bins corresponds to the maximum code length of the compression format being used. For example, the Xpress8 compression format has a maximum code length of 15 bits. Therefore, when using Xpress8, there are 15 CLBs, one for 1-bit codes, one for 2-bit codes, one for 3-bit codes, and so on. In some implementations, a code length lower than the maximum code length can be used. For example, a lower code length can be used if the compression format has no strict limit or to provide a more efficient implementation.

The assigned CLB for a given symbol represents the initial symbol length in bits. In some implementations, the new algorithm keeps track of the remaining code space (e.g., upon assigning a symbol to a CLB). The code space is defined by the maximum code length being used. For example, for Xpress8, the maximum code length is 15 bits, and the code space is 32,768 (which is the maximum available code space, and represents the maximum number of codes if all codes are 15 bits long). Remaining code space can be tracked using Equation 3.

$$\text{rem\_code\_space} -= 2^{maximum\_code\_length - CLB(sym)} \quad \text{(Equation 3)}$$

The remaining code space (rem_code_space or RCS) is initialized to the maximum code space, which in this example is 32,768 Shannon codes are of course legitimate realizable codes, which guarantees that rem_code_space will not become negative. Then, when a symbol is assigned to a CLB, the remaining code space is updated. For example, if a symbol is assigned to the 6-bit CLB, then the remaining code space is updated: rem_code_space=32,768−512=32, 256. If a symbol is then assigned to the 4-bit CLB, then the remaining code space is updated: rem_code_space=32,256−2,048=30,208.

In some implementations, each CLB is divided into a number of quantization intervals (QIs). Each QI represents a contiguous portion of the information content for each CLB. More specifically, the fractional portion of the information content is divided into the QIs. In some implementations, the fractional portion is divided evenly into a number of QIs. In some implementations, the fractional portion can be evenly divided into four QIs using Equation 4.

$$QI(sym) = 3 - \text{floor}((CLB(sym) - I(sym)) * 4) \quad \text{(Equation 4)}$$

QI 0 contains the most frequent symbols of a given CLB and QI 3 contains the least frequent symbols of a given CLB. In other implementations, a different number of QIs can be used, or a different process of dividing the fractional portion can be used (e.g., other than evenly dividing the fractional portion).

During Shannon-based binning, counts can be maintained for the number of symbols allocated to each CLB and/or to each QI. In some implementations, the only counts maintained for Shannon-based binning are the number of symbols allocated to each of the QIs for each of the CLBs. For example, if there are 15 CLBs each with four QIs, then 60 counts can be maintained (e.g., a 15×4 array of counts).

Code Space Optimization

In the technologies described herein, code space optimization is performed as part of the new algorithm. In some implementations, code space optimization is performed in the second phase of the new algorithm. Code space optimization is performed to shorten symbols to shorter code-length bins (e.g., from a given b-bit CLB to an b-1-bit CLB). For example, a symbol can be shortened (also referred to as "elevated") by moving the symbol from a 6-bit CLB to a 5-bit CLB, which is the next shorter code-length bin. For example, code space optimization can be performed because Shannon-based binning can produce a code space that is underutilized.

In some implementations, code space optimization is performed upon determining that the remaining code space (e.g., as maintained during Shannon-based binning) is greater than zero. If remaining code space is equal to zero, then code space optimization can be skipped (e.g., the code space has been fully utilized and no symbols need to be moved).

In some implementations, remaining code space is updated during code space optimization. For example, when a symbol is moved to a next smaller CLB, remaining code space is updated according to Equation 5. Code space optimization can proceed until remaining code space is near, or equal to, zero.

$$\text{rem\_code\_space} -= 2^{max-b} \quad \text{(Equation 5)}$$

In Equation 5, max is the maximum code length (e.g., 15 bits for Xpress8) and "b" is the number of bits of the CLB we are moving from. For example, if we are moving a symbol from a 6-bit CLB to a 5-bit CLB, then the remaining code space would be reduced by 512.

In some implementations, code space optimization is performed by elevating symbols that are in the most frequent QIs first. For example, QI 0 can be traversed first in all CLBs starting with CLB 2 (the 2-bit CLB; CLB 1 can't be shortened). For each QI, as many symbols as possible can be shortened such the code space is not oversubscribed (e.g., as maintained by remaining code space). The following algorithm can be used to shorten the symbols in QIs and CLBs.

For qi in 0 to 3 {
    For clb in 2 to 15 {
      reduction_per_sym=2^(15-clb)
      sym_to_shorten=max     (QIPop[clb][qi],     rem_code_space/reduction_per_sym)
      ShortenSymbols(clb, qi, sym_to_shorten)
      rem_code_space-=
         sym_to_shorten*reduction_per_sym
    }
  }

Note that reduction_per_sym is always a power of two, and can be represented by just the exponent, rather than the integer as shown. The divide becomes a right bit shift, and the multipy a left shift. As a performance optimization, the loops can be terminated when rem_code_space is zero. Additionally, it is not necessary to reconsider low-numbered CLBs, once rem_code_space<$2^{(15-clb)}$.

Elevating symbols (the ShortenSymbols( . . . ) call) only involves book keeping to remember how many symbols have been shortened. A larger numbered QI can only have shortened symbols if all prior, smaller numbered, QIs have been completely shortened. This is because the only thing that would prevent the prior QI from being completely shortened is inadequate remaining code space, which similarly limits later QIs.

As a result, the number of shortened symbols per QI does not need to be tracked. Rather, this can be done with two fields per CLB. The first field, maxShortenedQi[clb], indicates the largest (least frequent) QI that has shortened symbols. The second field, symShortened[clb], indicates how many symbols in that QI were shortened. All QIs smaller than maxShortenedQi are completely shortened. All QIs larger than maxShortenedQi have no shortened symbols.

The ShortenSymbols call manipulates the fields as follows:

```
ShortenSymbols(clb, qi, sym_to_shorten):
  if sym_to_shorten>0 {
    If sym_to_shorten==QiPop[clb][qi] {
      maxShortenedQi[clb]=qi+1
      symShortened[clb]=0
    }
    Else {
      maxShortenedQi[clb]=qi
      symShortened[clb]=sym_to_shorten
    }
  }
```

Tree Completion

In the technologies described herein, tree completion can be performed as part of the new algorithm. In some implementations, tree completion is an optional phase. For example, the Shannon-based binning and code space optimization phases can still leave the code space not fully utilized (when represented as a binary tree structure). In other words, the remaining code space may still be non-zero. The code tree interpretation is that the binary tree may not be full binary but contain parent nodes with only one child. Note that all Huffman trees are full binary trees. Some decompressors may expect this property to hold true for incoming codes. It is important to keep in mind that a full binary tree is not necessarily a Huffman (optimal) tree. Yet all Huffman trees are full binary trees.

The tree completion phase promotes nodes lower in the tree to higher level (lower lengths) hence filling in vacant children nodes higher in the tree. This algorithm handles arbitrary shaped trees though some constraints can be observed and leveraged for efficient hardware implementation. For example, a constraint can be imposed that holes can be at any level of the tree except for the first level (length 1).

In some implementations, tree completion takes into account only a symbol's code length without considering the corresponding QI. Also, tree completion can shorten symbols by more than one bit to reduce the remaining code space (RCS) to zero more quickly. Tree completion operates on the code length histogram (CLH) which is a per-length cumulative view of QIPop across QIs. Conceptually, tree completion uses RCS's binary representation as an indicator of node vacancies and surpluses in the binary code tree. The output of tree completion consists of a code lengths scoreboard (CLSB) tracking the FROM-TO node promotion counts. The CLSB is used in the final code assignment phase to shorten a symbol's code length.

In some implementations, the operations outlined below are performed for tree completion:
Iterate over the CLH until RCS !=0
1. get the MSb of the RCS which provides the result of FLOOR(log 2(RCS)); this is the length for which longer length symbols will be upgraded TO; reduce the length by 1 if RCS was a power of 2 and CLH entry corresponding to the TO (destination) code length bin is greater than 0; this length corresponds to the tree level with a node deficit.
2. reduce RCS by the code space taken by a single symbol at the TO length.
3. increment CLH entry of the TO length.
4. obtain the surplus length FROM which symbols will be moved; this is determined by the LSb of the updated CLH with the constraint that FROM length>TO length; this length corresponds to a tree level with surplus node.
5. decrement CLH entry of the FROM length.
6. update CLSB to account for the upgrade.

In some implementations, the tree completion phase fills in any missing nodes so that the code space is represented as a full binary tree.

Code Assignment

In the technologies described herein, code assignment is performed as part of the new algorithm. In some implementations, code assignment is performed in the last phase of the new algorithm (e.g., the third phase or fourth phase, depending on whether tree completion is performed). During code assignment, the final code length for each symbol can be computed by recomputing the CLB and QI, and following the per-QI adjustment information. Code assignment can be performed by using the Huffman code algorithm (e.g., the canonical Huffman code algorithm or another Huffman variant) given the bit length for each symbol.

In some implementations, the number of symbols of each length are maintained on the fly through the prior phases. Hence this information is known at the start of code assignment, without explicit revisiting of the symbols. Given this information, code space is divvied up by code length, initializing a code pointer (i.e., first code) for each of the 15 possible code lengths (or using a different number of possible code lengths, which depends on the compression format being used). For each symbol, its code length is recomputed as described herein (e.g., as described at 232), and it is assigned the current code pointer for its length. Its code pointer is then updated to the next code.

Example Block Diagram

FIG. 1 is a block diagram 100 depicting an example process for encoding data using the new algorithm that implements a flexible Huffman tree approximation. The operations performed by the example process are generally described as a data compression tool 105. However, the operations can be performed by various combinations of software and/or hardware resources.

In the block diagram 1, input data 110 is received. The input data 110 can be any type of data (e.g., text data, binary data, video data, audio data, etc.). At 120, symbol information is generated from the received input data 110. The symbol information can comprise symbol count and frequency information. In some implementations, the symbol information is generated by using the Lemple-Zif 77 (also referred to as LZ77) algorithm (e.g., as an initial stage of the Deflate compression algorithm).

At 130, Shannon-based binning is performed Shannon-based binning is performed to determine initial code lengths for the symbols and place the symbols into corresponding code-length bins based on the assigned initial code lengths. In some implementations, each CLB is divided into a number of QIs. Each QI represents a contiguous portion of the CLB based on the Shannon code length.

At 140, code space optimization is performed. Code space optimization is performed to shorten symbols to shorter code-length bins At 150, tree completion is performed. In some implementations, tree completion is an optional phase. Tree completion promotes nodes lower in the tree to a higher level (lower lengths) hence filling in "holes" higher in the tree.

At 160, code assignment is performed. During code assignment, the final code length for each symbol can be computed (e.g., by recomputing the CLB and QI, and following the per-QI adjustment information). Using the symbol information, prefix codes can be generated for encoding the input data 110. In some implementations, the prefix codes are generated according to the code assignment portion of the Huffman coding algorithm (e.g., according to the code assignment portion of the canonical Huffman coding algorithm).

At 170, the input data 110 is encoded using the codes assigned at 160. The encoded data is output as compressed data 180.

In some implementations, one or more of the operations depicted in the block diagram 100 are implemented in hardware. For example, a hardware component (e.g., an ASIC or FPGA) can implement some or all of the operations as part of a data compression process.

In some implementations, the block diagram 100 is implemented as part of cloud computing service. For example, the cloud computing service can provide a data storage service. One or more of the operations depicted in the block diagram 100 can be used to compress data when it is stored by the data storage service.

In some implementations, the block diagram 100 is implemented as part of a network data compression tool. For example, a source device (e.g., desktop or laptop computer, server, smartphone, or another type of computing device) or networking device (e.g., router, gateway, firewall, switch, or another type of networking device) can receive input data for transmission via a computer network and compress the input data using some or all of the operations described in the block diagram 100. The compressed data can be uncompressed by a subsequent networking device or a destination device (e.g., desktop or laptop computer, server, smartphone, or another type of computing device), or it can be stored in its compressed format (e.g., at the destination device).

Example High-Level Operational Block Diagram

Figure 2A:
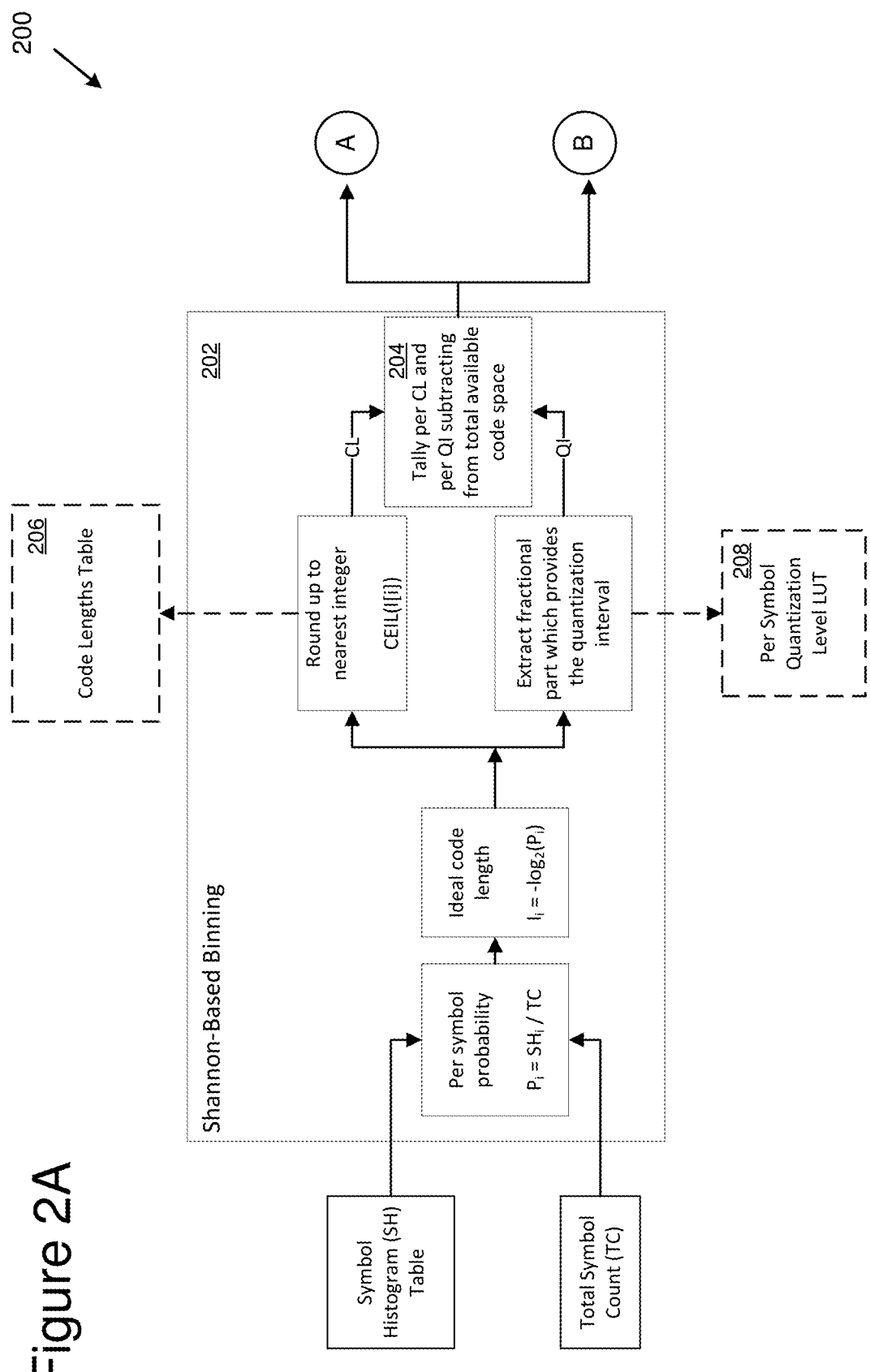
FIGS. 2A-2D depict a block diagram of an example process for performing a new algorithm for encoding symbols using a flexible Huffman tree approximation.

FIGS. 2A-2D depict an example high-level operational block diagram of the flexible Huffman approximation algorithm. The block diagram depicts a number of implementation details that may or may not be used in a particular implementation. For ease of illustration, the block diagram depicts an example implementation of the new algorithm for a maximum code length of 15 bits (and 15 CLBs), with up to 512 symbols, and uses four quantization intervals (4 QIs). Other implementations can have a different maximum code length, a different number of symbols, and/or a different number of quantization intervals. The following notations are followed in the example implementation depicted in FIGS. 2A-2D:

SH: symbol histogram (also referred to as symCnt[ ])
SH[i]: symbol histogram count of symbol i
TC: total symbol count (also referred to as SymTot)
QI: quantization interval
CL: code length (also referred to as CLB)
SBT: scoreboard table (also referred to as QIPop)
OBT: Optimization Boundaries Table
CLH: code length histogram
CLSB: code lengths scoreboard
RCS: remaining code space (also referred to as rem_code_space)
FBT: Full Binary Tree In general, the phases of the new algorithm are depicted in the block diagram in order from left to right. FIG. 2A depicts a first portion 200 of the block diagram describing an implementation of the Shannon-based binning phase 202. In the Shannon-based binning phase 202, the algorithm iterates over all histogram entries generating Shannon coding lengths corresponding to each symbol entry and tallying them per code length and per quantization interval. The remaining code space is also tracked (e.g., according to Equation 3) while iterating over the histogram entries in order to obtain the remaining code space used for subsequent optimization steps.

The Shannon-based binning phase 202 generally performs operations corresponding to those discussed above regarding Equations 1 and 2 to determine the initial code lengths. The Shannon-based binning phase 202 also divides the code length bins into quantization intervals (e.g., according to Equation 4) based on the fractional portions of the Shannon codes. Tallies (counts) are maintained per code length bin and per quantization interval, as depicted at 204. For example, a table can be created containing the symbol distribution over CLs and QIs.

The Shannon-based binning phase 202 divides the fractional portion of the Shannon code length into QIs. In some implementations, the fractional portion is divided as depicted in Table 2. Note that the fractional part of 0 is mapped to last (lowest-priority) QI since the symbol needs no optimization as its ideal code length is an integer.

TABLE 2

| QI | Fractional range |
|---|---|
| 0 | (0/4, 1/4) |
| 1 | (1/4, 1/4) |
| 2 | (2/4, 2/4) |
| 3 | (3/4, 4/4) |

The code lengths table 206 (CLT) (which is 512 by 4 bits in this example) contains the integer part of the ideal code length used as the baseline code length. It is the first optimization priority. In some implementations, maintaining the CLT is optional as indicated by the dashed lines (e.g., the code lengths can be recomputed at the code assignment stage).

The per symbol quantization interval look-up table (LUT) 208 (which is 512 by 2 bits in this example) contains the quantization intervals which indicate the second optimization priority of a symbol's code. In order to conserve storage resources, the per symbol quantization interval LUT can instead be re-computed at a later phase. In some implementations, maintaining the per symbol quantization interval LUT is optional as indicated by the dashed lines (e.g., the quantization intervals can be recomputed at the code assignment stage).

Figure 2B:
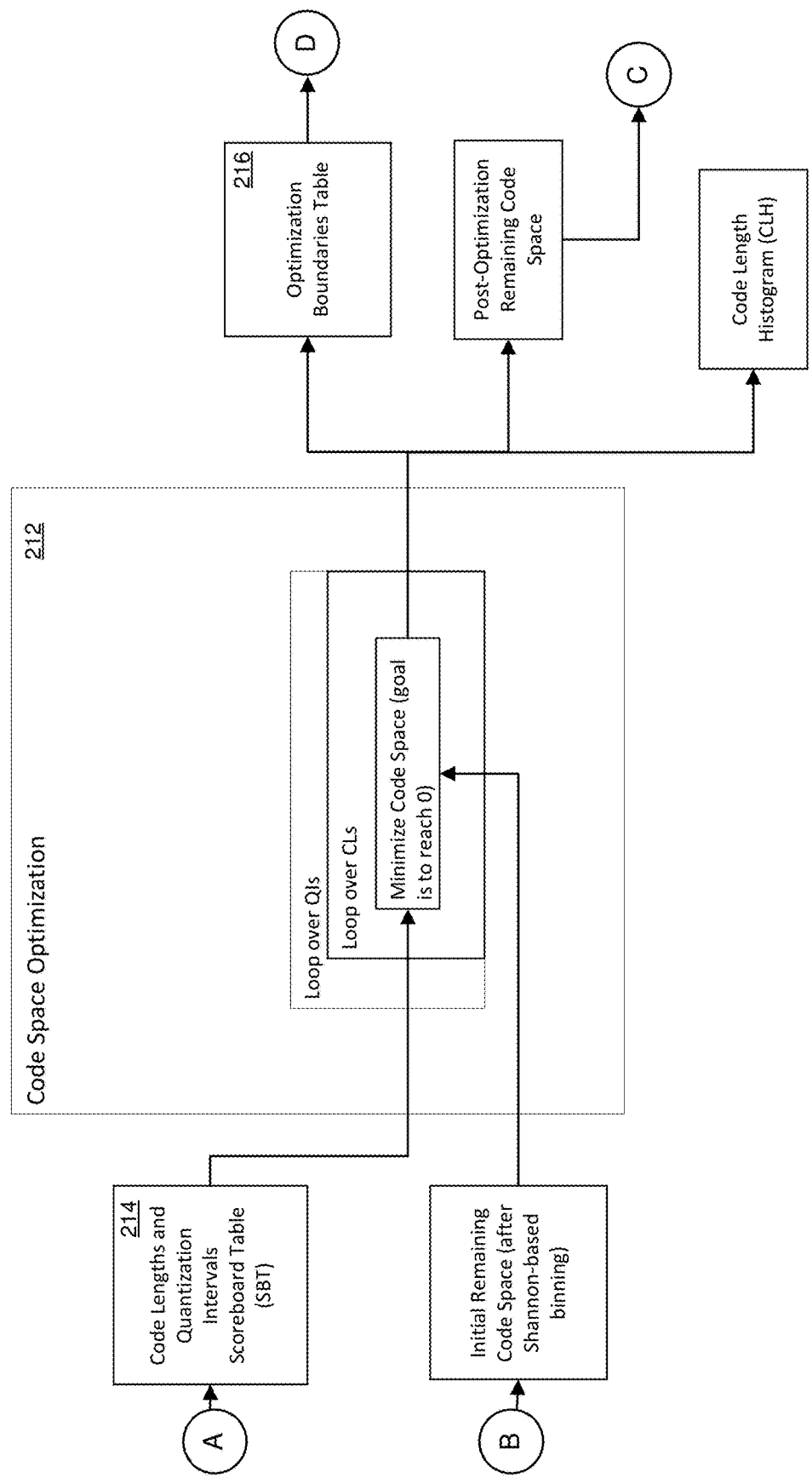

FIG. 2B depicts a second portion 210 of the block diagram describing an implementation of the code space optimization phase 212, which is also referred to as code lengths optimization in the figure.

As depicted at 214, a code lengths and quantization intervals scoreboard table (SBT) is maintained. The SBT can contain 15×4 entries. The SBT provides per code-length optimization priorities.

In some implementations, the code space optimization phase 212 processes the SBT with two nested loops, first over QIs then over the code lengths both in ascending (priority) order. At each step the optimizer computes the number of symbols that can have their length reduced by 1 such that the remaining code space does not become negative with an optimization goal of reaching exactly 0, which is not always possible depending on symbol distribution. In this way, the optimizer effectively compacts the code tree.

As depicted at 216, an optimization boundaries table (OBT) is generated (e.g., with 15 entries). The per CL optimization boundaries table consists of a QI and a symbol count indicating how many symbols can be optimized at the respective QI with all same CL symbols with higher priority QIs being implicitly optimized.

Figure 2C:
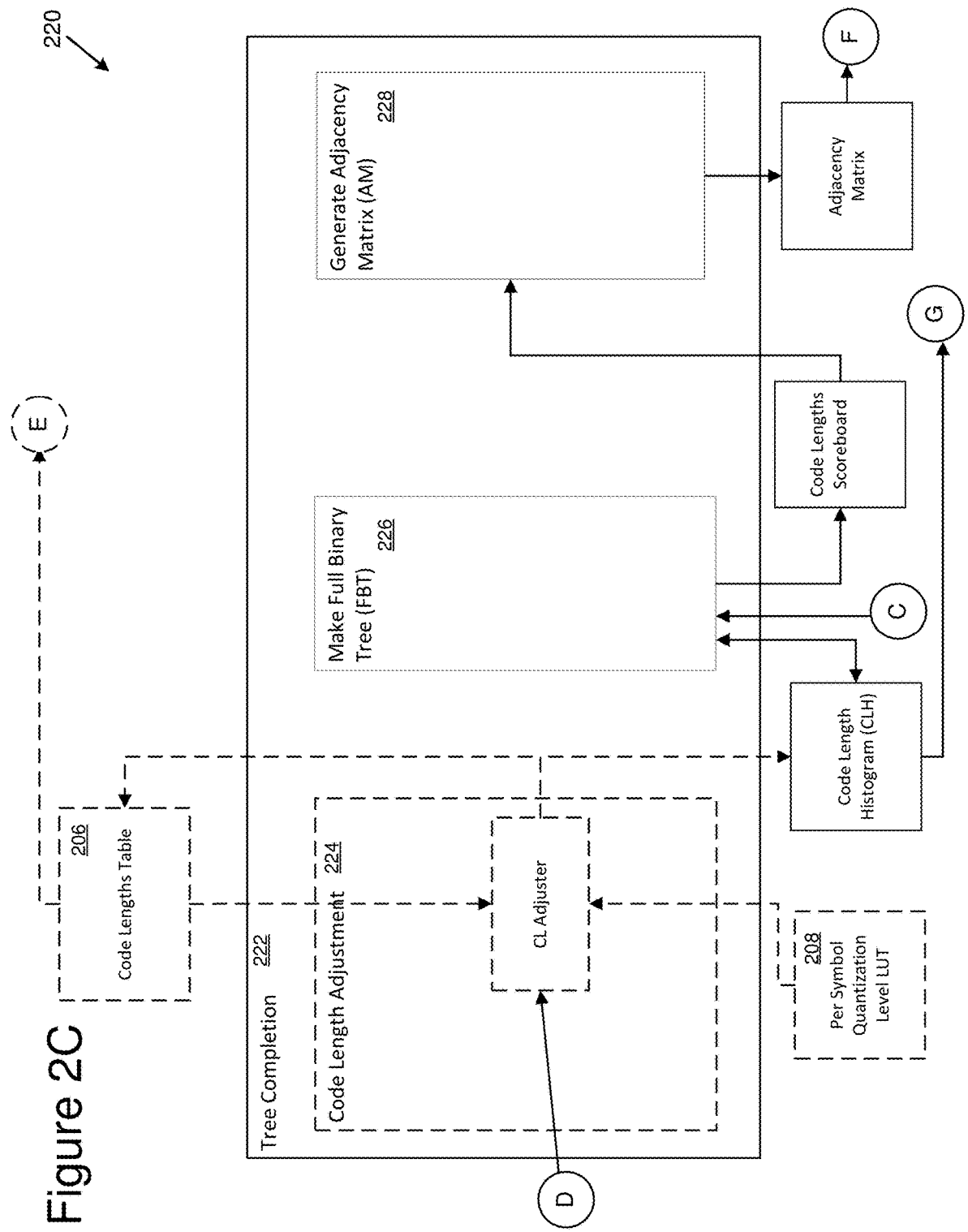

FIG. 2C depicts a third portion 220 of the block diagram describing an implementation of the tree completion phase 222. The tree completion phase 222 generates a fully binary tree, which implies a remaining code space of zero. The tree completion phase 222 includes a code length adjustment sub-phase 224 which iterates over the CLT in ascending symbol order reducing symbols lengths based on the CL/QI allocations from the OBT. The code length adjustment sub-phase 224 also builds the CL histogram (CLH) (which in this example has 15 entries) tracking the symbol code length distribution needed to enforce the strictly binary tree property. In some implementations, the code length adjustment sub-phase 224 is optional.

The tree completion phase 222 includes a make full binary tree (FBT) sub-phase 226 which iterates at most twice over the lengths histogram using the remaining code space binary representation to guide length reduction (symbol upgrades) at each iteration step bringing the remaining code space to 0. In some implementations, the make full binary tree (FBT) sub-phase 226 performs the following operations:

While remaining code space (RCS)>0
  get the MSb of the RCS which provides the result of FLOOR(log 2(RCS)); this is the length for which higher length symbols will be upgraded TO; subtract 1 if the RCS was a power of 2 and CLH entry corresponding to the TO (destination) code length bin is greater than 0
  update RCS, CLH, CLSB to account for the upgrade; CLSB tracks the symbol count deficit/surplus per code length
  obtain the surplus length FROM which symbols will be moved; this is determined by the LSb of the updated CLH with the constraint that FROM length>TO length The tree completion phase 222 includes a generate adjacency matrix (AM) sub-phase 228 which iterates twice over the CLSB translating it into a hardware optimized fast look-up table which serves as an Adjacency Matrix of FROM-TO symbol length upgrades. At most 2 symbols can be upgraded from one length to another.

Figure 2D:
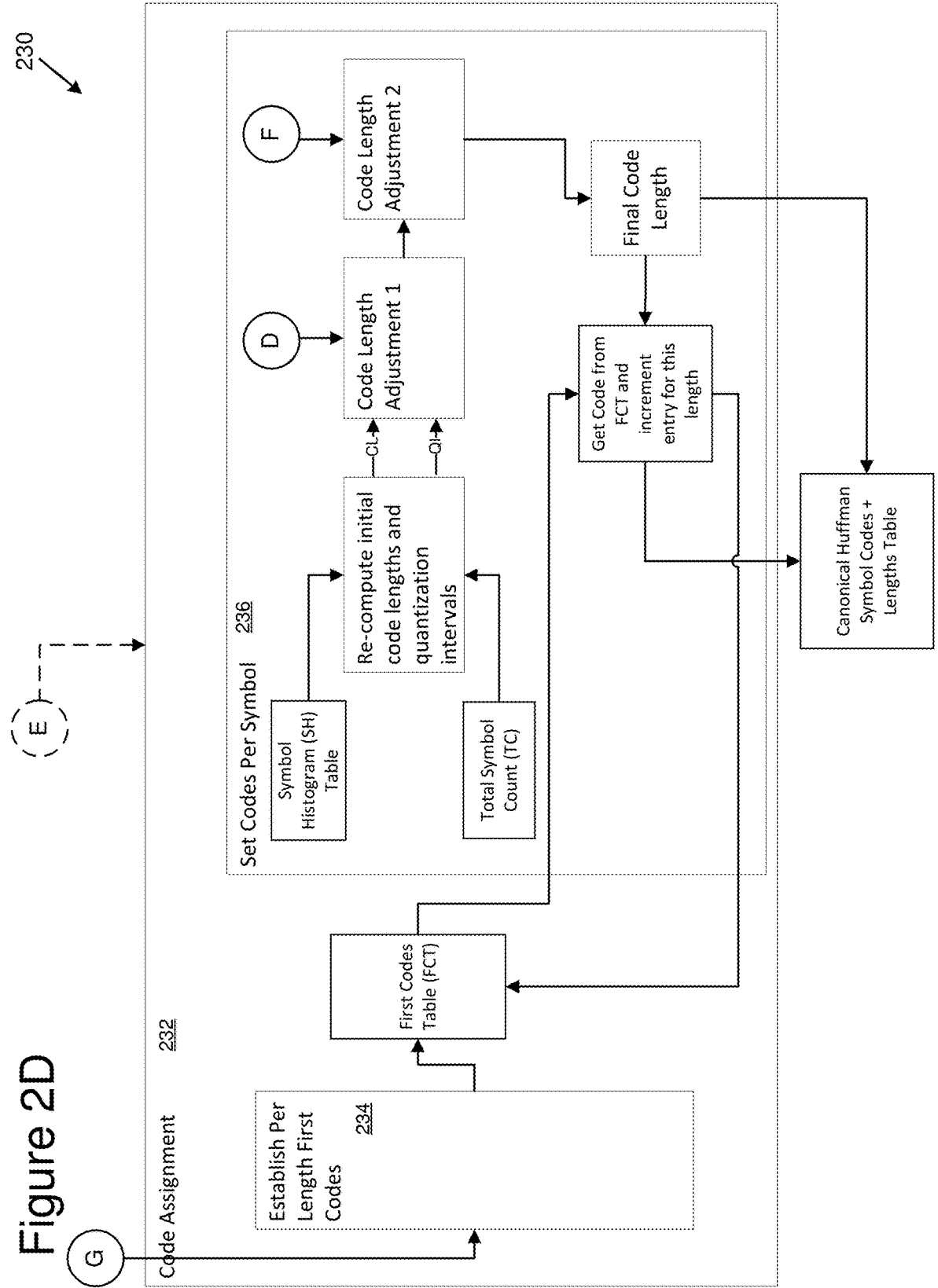

FIG. 2D depicts a fourth portion 230 of the block diagram describing an implementation of the code assignment phase 232. The code assignment phase 232 follows the canonical Huffman code book generation algorithm with the exception that it performs on-the-fly symbol length reductions.

The code assignment phase 232 includes an establish per length first codes sub-phase 234 which iterates over the CLH in ascending length order generating the first code for each length based on the length's histogram count. The first codes (which contains 15 entries in this example) are provided to the set codes per symbol sub-phase 236. The set codes per symbol sub-phase 236 iterates over all symbols in ascending order adjusting as needed each symbol's length per the AM and assigning codes according to each symbol's final CL. In some implementations, the set codes per symbol sub-phase 236 uses the code lengths table 206 generated earlier. In other implementations, the set codes per symbol sub-phase 236 rec-computes the initial code lengths and quantization intervals, as was done in the Shannon-based binning phase 202 (but without performing binning), and recomputes the code lengths, as depicted in the operations of the set codes per symbol sub-phase 236.

The code assignment phase 232 codes are assigned to the symbols according to the coding algorithm being used. In this implementation, the code assignment phase 232 generates canonical Huffman codes as output.

Methods for Encoding Symbols Using a Flexible Huffman Tree Approximation

In any of the examples herein, methods can be provided for encoding symbols using the new algorithm that implements a flexible Huffman tree approximation.

Figure 3:
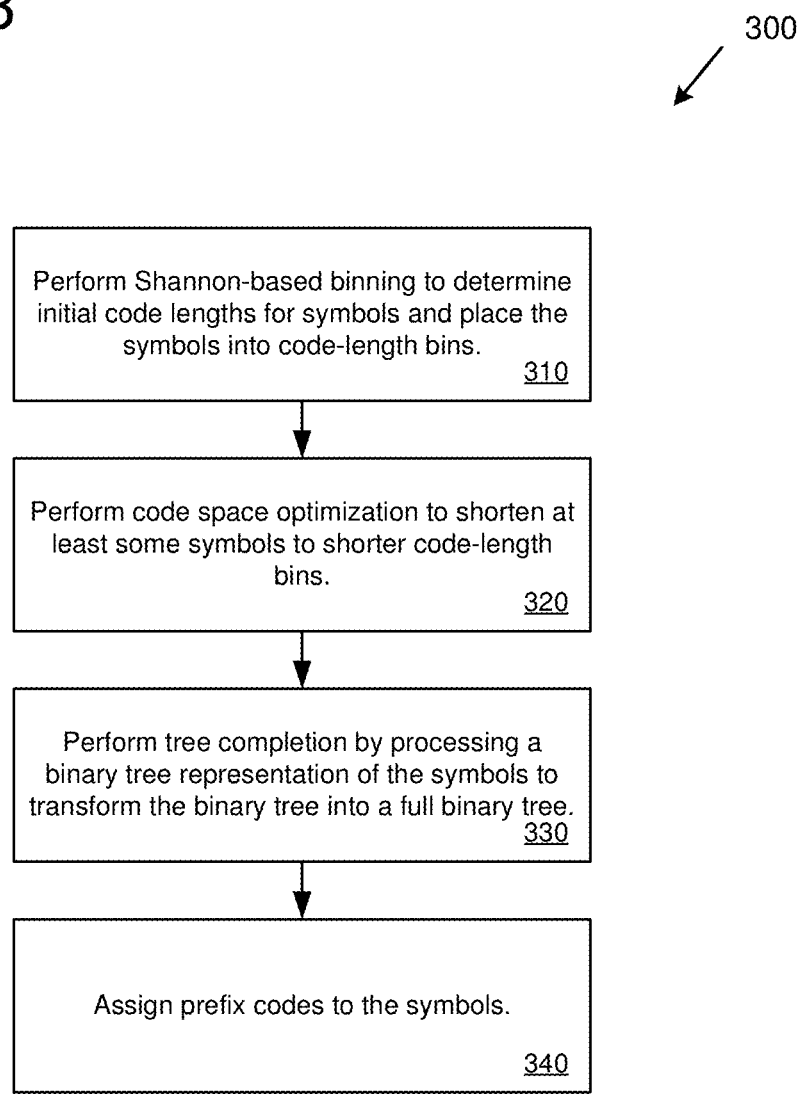
FIG. 3 is a flowchart of an example method for encoding symbols.

FIG. 3 is a flowchart of an example method 300 for encoding symbols using the new algorithm. For example, the example method 300 can be performed by a computing device (e.g., via software running on the computing device) and/or by a hardware component of the computing device (e.g., by an ASIC for FPGA).

At 310, Shannon-based binning is performed to determine initial code lengths for the symbols and place the symbols into corresponding code-length bins (CLBs) based on the assigned initial code lengths. Shannon-based binning can be performed as part of a first phase of the encoding process. In some implementations, the CLBs are divided into quantization intervals. In some implementations, the symbols are received from another compression or encoding tool, such as from a tool using the deflate compression algorithm. For example, data to be compressed can be received (e.g., as a file, as streaming data, or in another format). The data can be processed to generate symbol information, which can be provided as input to the example method 300.

At 320, code space optimization is performed to shorten at least some of the symbols to shorter code-length bins. For example, elevating symbols can be performed based on the amount of remaining code space. Code space optimization can be performed as part of a second phase of the encoding process. In some implementations, code space optimization is performed when remaining code space is greater than a threshold value (e.g., when code space is greater than zero). For example, if remaining code space is less than or equal to the threshold value, then code space optimization can be skipped.

At 330, tree completion is performed by processing a binary tree representation of the symbols to transform the binary tree into a full binary tree. In some implementations, tree completion is not performed (e.g., tree completion can be an optional phase).

At 340, prefix codes are assigned to the symbols based at least in part on the code-length bins. In some implementations the prefix codes are assigned according to the code assignment portion of the Huffman coding algorithm (e.g., according to the code assignment portion of the canonical Huffman coding algorithm).

Figure 4:
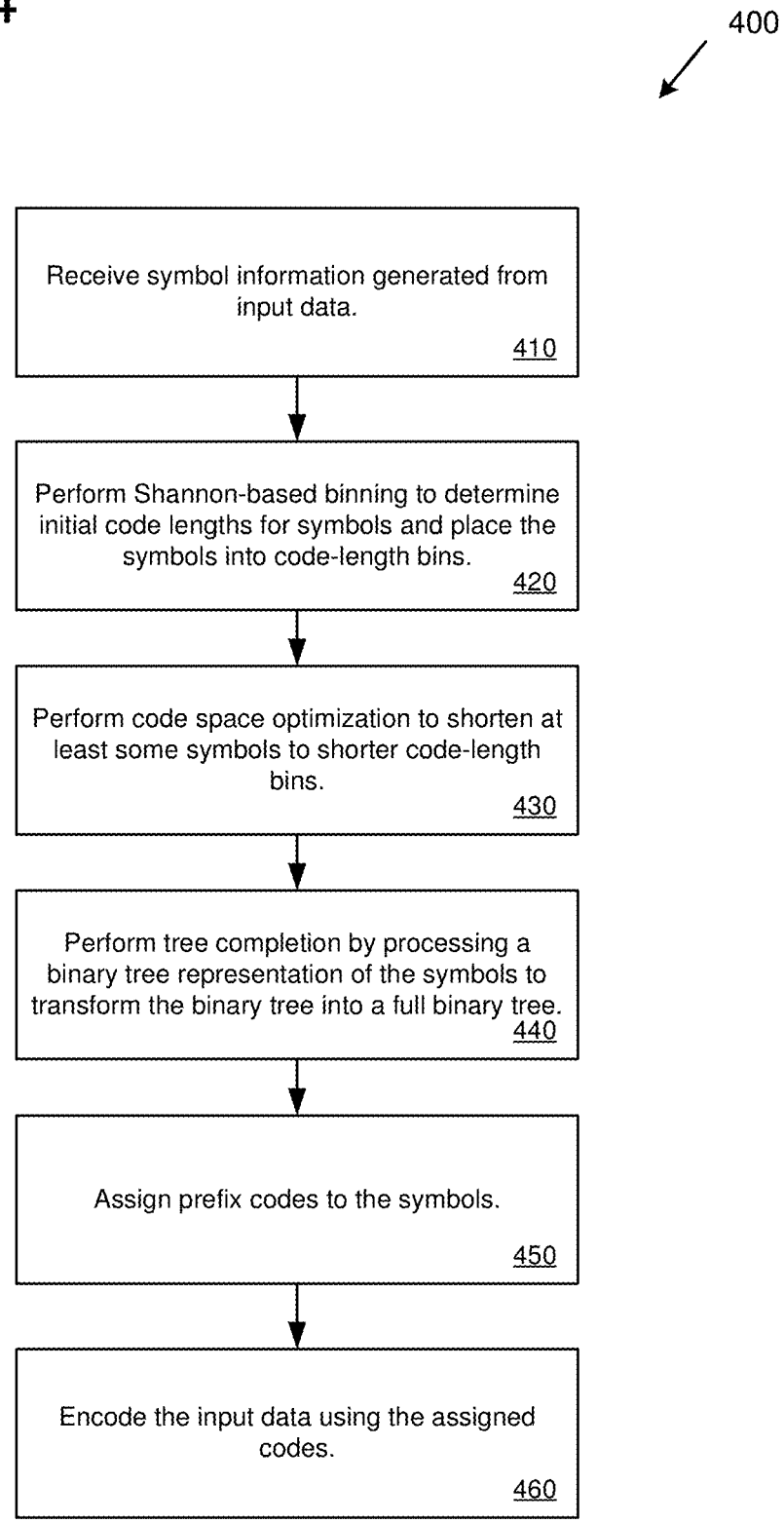
FIG. 4 is a flowchart of an example method for encoding symbols.

FIG. 4 is a flowchart of an example method 400 for encoding symbols using the new algorithm. For example, the example method 400 can be performed by a computing device (e.g., via software running on the computing device) and/or by a hardware component of the computing device (e.g., by an ASIC for FPGA).

At 410, symbol information is received. The symbol information is generated from input data (e.g., an input file, streaming data, etc.). The symbol information comprises the symbols generated from the input data long with frequency information. In some implementations, the symbol information is generated from a compression algorithm (e.g., using the LZ77 algorithm).

At 420, Shannon-based binning is performed to determine initial code lengths for the symbols and place the symbols into corresponding code-length bins (CLBs) based on the assigned initial code lengths. Shannon-based binning can be performed as part of a first phase of the encoding process. In some implementations, the CLBs are divided into quantization intervals.

At 430, code space optimization is performed to shorten at least some of the symbols to shorter code-length bins. For example, elevating symbols can be performed based on the amount of remaining code space. Code space optimization can be performed as part of a second phase of the encoding process. In some implementations, code space optimization is performed when remaining code space is greater than a threshold value (e.g., when code space is greater than zero). For example, if remaining code space is less than or equal to the threshold value, then code space optimization can be skipped.

At 440, tree completion is performed by processing a binary tree representation of the symbols to transform the binary tree into a full binary tree. In some implementations, tree completion is not performed (e.g., tree completion can be an optional phase).

At 450, prefix codes are assigned to the symbols based at least in part on the code-length bins. In some implementations the prefix codes are assigned according to the code assignment portion of the Huffman coding algorithm (e.g., according to the code assignment portion of the canonical Huffman coding algorithm).

At 460, the input data is encoded using the assigned codes (e.g., using the assigned Huffman codes). The encoded input data, which is now in a compressed format, can be output (e.g., saved as a compressed file on a storage device, transmitted as a compressed data stream to a network device, etc.).

Integer Implementation

The new algorithm can be efficiently implemented (e.g., in hardware, such as ASICs and FPGAs) using an integer implementation.

A register-transfer level (RTL) implementation should avoid costly and inexact floating-point computation, especially log 2 and division. Furthermore, the CLB must never be smaller than the exact value, or code space may overflow resulting in functional incorrectness. To solve these potential issues, an efficient and exact integer calculation has been developed using the transformation below.

CLB(sym)=clb ceil($I$(sym))=clb clb−1<$I$(sym)<=clb clb−1<−log 2(symCnt[sym]/symTot)<=clb clb−1<log 2(symTot/symCnt[sym])<=clb $2^{clb-1}$<symTot/symCnt[sym]<=$2^{clb}$ $2^{clb-1}$*symCnt[sym]<symTot<=$2^{clb}$*symCnt[sym]

$2^{clb}$*symCnt[sym]<symTot*2<=2*$2^{clb}$*symCnt[sym]

$2^{clb}$*symCnt[sym]<symTot*2 symTot*2<=2*$2^{clb}$*symCnt[sym]

symTot<=$2^{clb}$*symCnt[sym]<symTot*2

The CLB can be computed by first aligning the high-order bit of symCnt[sym] with the high-order bit of symTot, and then comparing to symTot. Call the number of bits shifted clb' clb=clb' if symTot<=$22^{clb-1}$*symCnt[sym]

clb=clb'+1 otherwise

QIs are an optimization, and the exact calculation will not affect correctness. QIs are computed using cut-points between symTot and 2*symTot. Cut-points are precomputed once up front. In this implementation simple linear cut-points are used, although a log-based pattern is arguably more precise from an information-theoretic perspective. With four QIs, the following QI cut-points, depicted in Table 3, would be used in this implementation.

TABLE 3

| Quantization interval boundaries $2^{clb_i}$ * symCnt[sym] | | |
|---|---|---|
| | <= | < |
| QI = 0 | symTot | 5/4 * symTot |
| QI = 1 | 5/4 * symTot | 6/4 * symTot |
| QI = 2 | 6/4 * symTot | 7/4 * symTot |
| QI = 3 | 7/4 * symTot | 2 * symTot |

In this manner, QIs can also be computed using integer arithmetic. Rounding when computing the cut points is not critical.

Hardware Implementation

The new algorithm can be efficiently implemented in hardware, such as ASICs and FPGAs. For instance, the technology can enable parallel computation of multiple symbols. The number of symbols processed per cycle will depend on factors such as die area constraints, target frequency and the technology being used. A typical implementation might process up to 4 symbols per cycle. During Shannon-based binning, symCnt can be implemented in an array, for instance and SRAM. Since accesses to the symbol counts are sequential, multiple symbol consecutive counts can easily be read at once. The computation of CLB and QI is completely independent for each symbol, so multiple symbols can be handled in parallel.

Updates to QIPop involve simple logic and increments. Multiple increments to the same entry can be merged together into a single add, thereby allows multiple symbols to be tallied in parallel.

The code space optimization loop (e.g., depicted at 212 in FIG. 2B) is serialized on the update to RCS. Hence each iteration is handled one at a time. Hence, each iteration of loop 212 is serialized. However, that loop can be reduced to simple integer arithmetic, typically implemented in a single cycle. Furthermore, code space optimization will typically run only a few iterations.

Code assignment involves a second pass thru the symbols. Multiple symbols can compute their final code length by 1) reading symbol counts and computing Shannon-based CLB and QI in parallel, 2) applying OBT CLB updates from code space optimization in parallel and 3) applying AM updates tree completion in parallel and 4) assigning codes based on the FCT in parallel. As with Shannon-base binning, the symbol counts, CLBs and QIs can all be read and computed in parallel, typically using the same hardware pipeline. Updates to the OBT can be optimized by merging updates for multiple symbols, when multiple symbols have the same CLB and QI, allowing multiple symbols to be processed in a single cycle. Similarly, updates to the AM can be merged when multiple symbols have the same CLB (following OBT adjustment). This produces final code lengths for multiple symbols every cycle.

Finally, codes are assigned by consulting the FCT based on the final code length. When multiple symbols have the same final code length in the same cycle, their updates to the FCT can be merged, converting multiple increments into a single small addition. This results in the final assigned code for multiple symbols each cycle.

Computing Systems

Figure 5:
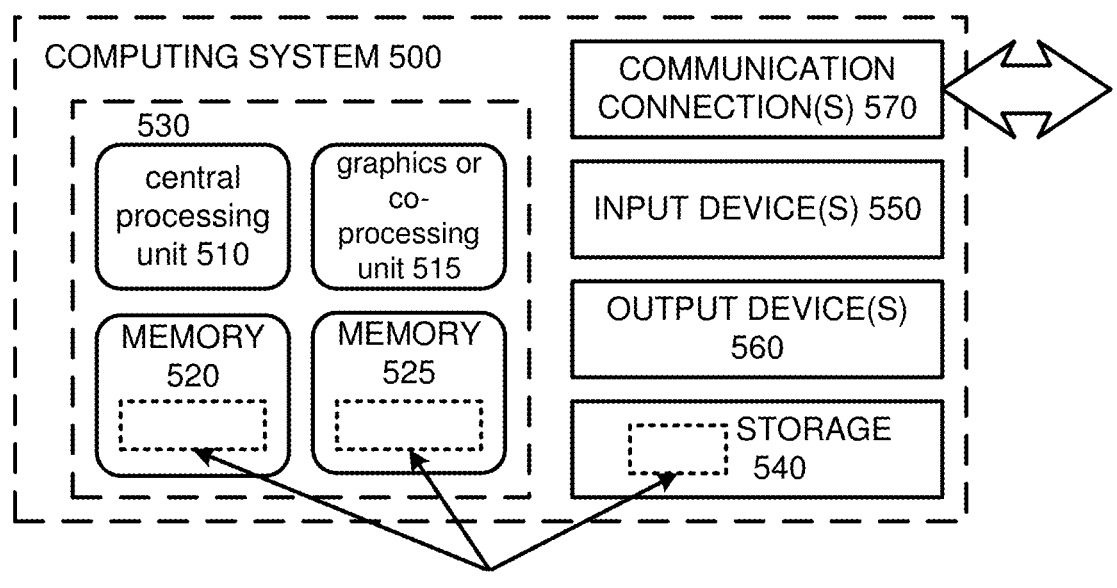
FIG. 5 is a diagram of an example computing system in which some described embodiments can be implemented.

FIG. 5 depicts a generalized example of a suitable computing system 500 in which the described technologies may be implemented. The computing system 500 is not intended to suggest any limitation as to scope of use or functionality, as the technologies may be implemented in diverse general-purpose or special-purpose computing systems.

With reference to FIG. 5, the computing system 500 includes one or more processing units 510, 515 and memory 520, 525. In FIG. 5, this basic configuration 530 is included within a dashed line. The processing units 510, 515 execute computer-executable instructions. A processing unit can be a general-purpose central processing unit (CPU), processor in an application-specific integrated circuit (ASIC), or any other type of processor. A processing unit can also comprise multiple processors. In a multi-processing system, multiple processing units execute computer-executable instructions to increase processing power. For example, FIG. 5 shows a central processing unit 510 as well as a graphics processing unit or co-processing unit 515. The tangible memory 520, 525 may be volatile memory (e.g., registers, cache, RAM), non-volatile memory (e.g., ROM, EEPROM, flash memory, etc.), or some combination of the two, accessible by the processing unit(s). The memory 520, 525 stores software 580 implementing one or more technologies described herein, in the form of computer-executable instructions suitable for execution by the processing unit(s).

A computing system may have additional features. For example, the computing system 500 includes storage 540, one or more input devices 550, one or more output devices 560, and one or more communication connections 570. An interconnection mechanism (not shown) such as a bus, controller, or network interconnects the components of the computing system 500. Typically, operating system software (not shown) provides an operating environment for other software executing in the computing system 500, and coordinates activities of the components of the computing system 500.

The tangible storage 540 may be removable or non-removable, and includes magnetic disks, magnetic tapes or cassettes, CD-ROMs, DVDs, or any other medium which can be used to store information and which can be accessed within the computing system 500. The storage 540 stores instructions for the software 580 implementing one or more technologies described herein.

The input device(s) 550 may be a touch input device such as a keyboard, mouse, pen, or trackball, a voice input device, a scanning device, or another device that provides input to the computing system 500. For video encoding, the input device(s) 550 may be a camera, video card, TV tuner card, or similar device that accepts video input in analog or digital form, or a CD-ROM or CD-RW that reads video samples into the computing system 500. The output device(s) 560 may be a display, printer, speaker, CD-writer, or another device that provides output from the computing system 500.

The communication connection(s) 570 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The technologies can be described in the general context of computer-executable instructions, such as those included in program modules, being executed in a computing system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Cloud-Supported Environment

Figure 6:
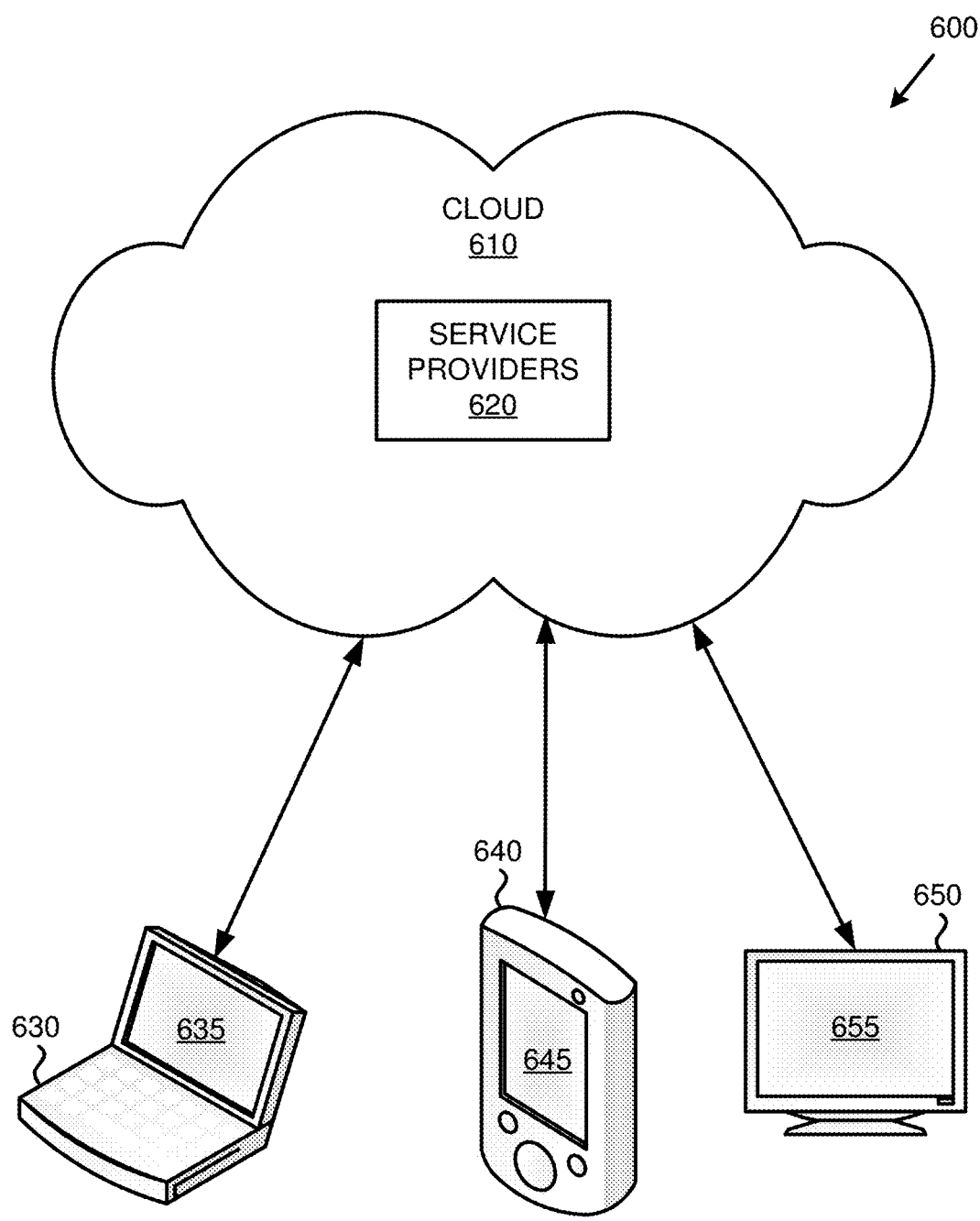
FIG. 6 is an example cloud-support environment that can be used in conjunction with the technologies described herein.

FIG. 6 illustrates a generalized example of a suitable cloud-supported environment 600 in which described embodiments, techniques, and technologies may be implemented. In the example environment 600, various types of services (e.g., computing services) are provided by a cloud 610. For example, the cloud 610 can comprise a collection of computing devices, which may be located centrally or distributed, that provide cloud-based services to various types of users and devices connected via a network such as the Internet. The implementation environment 600 can be used in different ways to accomplish computing tasks. For example, some tasks (e.g., processing user input and presenting a user interface) can be performed on local computing devices (e.g., connected devices 630, 640, 650) while other tasks (e.g., storage of data to be used in subsequent processing) can be performed in the cloud 610.

In example environment 600, the cloud 610 provides services for connected devices 630, 640, 650 with a variety of screen capabilities. Connected device 630 represents a device with a computer screen 635 (e.g., a mid-size screen). For example, connected device 630 could be a personal computer such as desktop computer, laptop, notebook, netbook, or the like. Connected device 640 represents a device with a mobile device screen 645 (e.g., a small size screen). For example, connected device 640 could be a mobile phone, smart phone, personal digital assistant, tablet computer, and the like. Connected device 650 represents a device with a large screen 655. For example, connected device 650 could be a television screen (e.g., a smart television) or another device connected to a television (e.g., a set-top box or gaming console) or the like. One or more of the connected devices 630, 640, 650 can include touchscreen capabilities. Touchscreens can accept input in different ways. For example, capacitive touchscreens detect touch input when an object (e.g., a fingertip or stylus) distorts or interrupts an electrical current running across the surface. As another example, touchscreens can use optical sensors to detect touch input when beams from the optical sensors are interrupted. Physical contact with the surface of the screen is not necessary for input to be detected by some touchscreens. Devices without screen capabilities also can be used in example environment 600. For example, the cloud 610 can provide services for one or more computers (e.g., server computers) without displays.

Services can be provided by the cloud 610 through service providers 620, or through other providers of online services (not depicted). For example, cloud services can be customized to the screen size, display capability, and/or touchscreen capability of a particular connected device (e.g., connected devices 630, 640, 650).

In example environment 600, the cloud 610 provides the technologies and solutions described herein to the various connected devices 630, 640, 650 using, at least in part, the service providers 620. For example, the service providers 620 can provide a centralized solution for various cloud-based services. The service providers 620 can manage service subscriptions for users and/or devices (e.g., for the connected devices 630, 640, 650 and/or their respective users).

Example Implementations

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media and executed on a computing device (i.e., any available computing device, including smart phones or other mobile devices that include computing hardware). Computer-readable storage media are tangible media that can be accessed within a computing environment (one or more optical media discs such as DVD or CD, volatile memory (such as DRAM or SRAM), or nonvolatile memory (such as flash memory or hard drives)). By way of example and with reference to FIG. 5, computer-readable storage media include memory 520 and 525, and storage 540. The term computer-readable storage media does not include signals and carrier waves. In addition, the term computer-readable storage media does not include communication connections, such as 570.

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology.

What is claimed is:

1. A computing device comprising:
a processor; and
memory;
the computing device configured to perform operations for encoding a plurality of symbols, the operations comprising:
as part of a first phase, performing Shannon-based binning to determine initial code lengths for the symbols and place the symbols into corresponding code-length bins (CLBs) based on the determined initial code lengths;

as part of a second phase, performing code space optimization to shorten at least some of the symbols to shorter code-length bins; and as part of a third phase, assigning prefix codes to the symbols based at least in part on the code-length bins.

2. The computing device of claim 1, wherein performing Shannon-based binning comprises:

assigning each symbol to one of the code-length bins that corresponds to its Shannon code length; and dividing the code-length bins into quantization intervals.

3. The computing device of claim 1, wherein performing Shannon-based binning comprises:

dividing each of the code-length bins into a plurality of quantization intervals;

wherein each symbol is assigned to one of the quantization intervals within one of the code-length bins.

4. The computing device of claim 3, wherein performing Shannon-based binning comprises:

maintaining a count of symbols that have been placed into each of the quantization intervals in each of the code-length bins.

5. The computing device of claim 1, wherein performing code space optimization comprises:

for each of one or more code-length bins:
moving one or more most frequently occurring symbols in the code-length bin to a next shorter code-length bin which has a shorter code length.

6. The computing device of claim 1, wherein each code-length bin is divided into a plurality of quantization intervals, and wherein performing code space optimization comprises:

for each of one or more code-length bins:
moving one or more symbols in the code-length bin that are associated with a most frequent quantization interval to a next shorter code-length bin which has a shorter code length.

7. The computing device of claim 1, wherein performing code space optimization comprises:

determining whether remaining code space is greater than zero;

when remaining code space is greater than zero, performing code space optimization comprising moving at least one symbol to a next shorter code-length bin;

when remaining code space is equal to zero, proceeding to a next phase without moving any symbols.

8. The computing device of claim 1 the operations further comprising:

as part of a new phase after the second phase and before the third phase, performing tree completion by processing a binary tree representing the symbols to transform the binary tree into a full binary tree.

9. The computing device of claim 8, wherein processing the binary tree comprises:

promoting nodes lower in the binary tree to fill in missing nodes higher in the binary tree.

10. The computing device of claim 1, the operations further comprising:

receiving the plurality of symbols representing data to be compressed, wherein the plurality of symbols were generated from a deflate algorithm.

11. The computing device of claim 1, wherein the prefix codes are assigned according to canonical Huffman coding.

12. The computing device of claim 1, wherein the operations are performed by a field-programmable gate array (FPGA) or application-specific integrated circuits (ASIC) of the computing device.

13. A method, implemented by a computing device, for encoding a plurality of symbols, the method comprising:

performing Shannon-based binning to determine initial code lengths for the symbols and place the symbols into corresponding code-length bins (CLBs) based on the determined initial code lengths;

performing code space optimization to shorten at least some of the symbols to shorter code-length bins; and assigning prefix codes to the symbols based at least in part on the code-length bins.

14. The method of claim 13, wherein performing Shannon-based binning comprises:

assigning each symbol to one of the code-length bins that corresponds to its Shannon code length; and dividing the code-length bins into quantization intervals.

15. The method of claim 13, wherein performing Shannon-based binning comprises:

dividing each of the code-length bins into a plurality of quantization intervals;

wherein each symbol is assigned to one of the quantization intervals within one of the code-length bins.

16. The method of claim 13, wherein performing Shannon-based binning comprises:

maintaining a count of symbols that have been placed into each of the quantization intervals in each of the code-length bins.

17. The method of claim 13, wherein performing code space optimization comprises:

for each of one or more code-length bins:
moving one or more most frequently occurring symbols in the code-length bin to a next shorter code-length bin which has a shorter code length.

18. The method of claim 13, wherein each code-length bin is divided into a plurality of quantization intervals, and wherein performing code space optimization comprises:

for each of one or more code-length bins:
moving one or more symbols in the code-length bin that are associated with a most frequent quantization interval to a next shorter code-length bin which has a shorter code length.

19. A method, implemented by a computing device, for encoding a plurality of symbols, the method comprising:

receiving symbol information generated from input data, wherein the symbol information comprises the symbols and their associated frequencies;

as part of a first phase, performing Shannon-based binning to determine initial code lengths for the symbols and place the symbols into corresponding code-length bins (CLBs) based on the determined initial code lengths;

as part of a second phase, performing code space optimization to shorten at least some of the symbols to shorter code-length bins;

as part of a third phase, performing tree completion by processing a binary tree representing the symbols to transform the binary tree into a full binary tree;

as part of a fourth phase, assigning prefix codes to the symbols based at least in part on the code-length bins; and encode the input data using the assigned prefix codes to generate compressed output data.

20. The method of claim 19, wherein performing Shannon-based binning comprises:

assigning each symbol to one of the code-length bins that corresponds to its Shannon code length; and dividing the code-length bins into quantization intervals.

* * * * *